PROCESS FOR INCREASING PHOTORESIST ADHESION TO A SEMICONDUCTOR BY TREATING THE SEMICONDUCTOR WITH A DISILYLAMIDE

Filed Jan. 15, 1969

INVENTORS.
ROGER A. COUTURE
ROBERT T. GLEASON
JOHN J. LAJZA, JR.
BY
Willis E. Higgins
ATTORNEY United States Patent Office 3,586,554

Patented June 22, 1971

3,586,554

PROCESS FOR INCREASING PHOTORESIST ADHESION TO A SEMICONDUCTOR BY TREATING THE SEMICONDUCTOR WITH A DISILYLAMIDE

Roger A. Couture, Richmond, Robert T. Gleason, South Burlington, and John J. Lajza, Jr., Williston, Vt., assignors to International Business Machines Corporation, Armonk, N.Y.

Filed Jan. 15, 1969, Ser. No. 791,214
Int. Cl. H01l 7/00
U.S. Cl. 156—17 11 Claims

ABSTRACT OF THE DISCLOSURE

Very small patterns may be etched in silicon dioxide or other oxide surfaces using photoresist to mask areas of surfaces where etching is not desired by applying a disilylamide to the surface to increase the ahesion of the photoresist. The process is particularly useful for etching patterns in silicon dioxide masks used in the fabrication of microminiature semiconductor devices.

FIELD OF THE INVENTION

This invention relates to a process for increasing the adhesion of photoresist to an oxide surface. More particularly, it relates to a process for treating an oxide surface to increase the adhesion of photoresist to the oxide, thus enabling smaller patterns to be reproducibly etched in the oxide. Most especially, the invention relates to a process for producing silicon dioxide masks used for the selective diffusion of impurities into semiconductors.

THE PRIOR ART

In the fabrication of a variety of articles, it is often necessary to protect selected areas of an oxide surface while other areas of the same surface are being exposed to further process procedures. For example, in the fabrication of semiconductor devices, wherein an oxide coating is formed on a semiconductor substrate, it is often necessary to remove selected portions of the oxide coating so as to permit diffusion of a suitable impurity through the oxide layer into the underlying semiconductor devices, such as single crystal field effect transistors. This type of device is formed by vapor diffusing a suitable impurity into a wafer of a single silicon crystal to form suitable P-type and N-type junctions therein. In order to provide distinct P and N junctions, which are necessary for the proper operation of the device, diffusion should occur through only a limited portion of the substrate. Normally, this is accomplished by masking the substrate with a diffusion-resistant material, such as silicon dioxide, which is formed into a protective mask to prevent diffusion through the selected regions of the substrate. The silicon dioxide mask is typically provided by forming a uniform oxide layer over the wafer substrate and thereafter creating a series of openings through the oxide layer which allow the passage of the impurity directly into the underlying surface within a limited area. These openings are readily created by coating the oxide with a material known as a photoresist. This may be either a material capable of polymerizing and insolubilizing on exposure to light (a negative resist), or a material capable of depolymerizing and solubilizing on exposure to light (a positive resist). The photoresist coating is selectively exposed to light, causing polymerization or depolymerization to occur above those regions of the oxide which are intended to be protected or etched for the subsequent diffusion. The soluble portions of the photoresist are removed by a solvent which is inert to the polymerized portion of the resist. A suitable etchant for silicon dioxide, such as hydrogen fluoride, is applied to remove the unprotected oxide regions.

It has been observed, however, that upon exposure of the masked silicon dioxide surface to the etchant, the photoresist coating tends to curl away from the oxide surface. This permits severe undercutting of the layer immediately beneath the edges of the protective photoresist. The result is to expose additional areas of the silicon substrate to the impurity diffusion and create deleteriously indistinct P and N-type junctions. The resulting semiconductor device is therefore characterized by a significantly decreased output relative to that which should theoretically be provided. In field effect transistors at least two openings must be created through the oxide surface, corresponding to the source and drain of the device. Thus, there are at least four edges whose lack of resolution will influence the width of the source and drain and, more importantly, the width of the gate lying between the source and drain. Furthermore, the impurity tends to spread after entering the wafer body. Since two separate diffusion regions are being generated simultaneously, the probability of shorting within the device, especially if narrow gate widths are desired, becomes increasingly more probable as the lack of resolution increases.

Recognizing this problem, the art first proposed heating the photoresist prior to etching, such as by post baking, with the hope of providing a more adherent bond between the oxide surface and the resist to prevent the "curling" or lifting effect which seems to cause the lack of resolution. Post-baking has not proved to be an altogether satisfactory technique because its effectiveness is largely dependent on the particular oxide substrate being treated and on the surface conditions of the oxide layer, whether it contains impurities, such as phosphorous pentoxide, or water. Moreover, the normal variations in the oxide thickness result in certain layers being exposed to the etching solution longer than others, thereby accentuating the degree of resist curling or lifting, and requiring a greater degree of post-baking in some regions than in others for the same substrate. Not only is post-baking a more unreliable means for bonding a photoresist to an oxide surface, but after treating the selected portions of the surface, the post-baked resist is often more difficult to remove. Post-baking cannot, therefore, be used as a routine procedure.

It has ben determined that a more advantageous method for preventing resolution losses is to precoat the oxide surface with an adhesion promoter which will bond the photoresist more adherently to the oxide substrate. While several adhesive coating compositions have been proposed heretofore, none has proved to be entirely satisfactory. Those having suitable bonding abilities are generally toxic, having corrosive by-products, and often require some degree of post-baking.

Although the problem of treating oxide surfaces with coatings of photoresist has ben described principally in terms of the formation of semiconductor devices, the same problems have been found to occur in the formation of other types of articles in which an oxide surface is selectively etched as well.

A further problem with the prior art silicon-containing adhesion promoters is that some period of time, such as 30 seconds or longer, is often required to allow the adhesion promoters to contact the oxide suface prior to application of the photoresist. An adhesion promoter which enables such a period of waiting to be eliminated would be advantageous.

SUMMARY OF THE INVENTION

Accordingly, it an object of the invention to increase the adhesion of photoresist to oxide surfaces.

It is a further object of the invention to decrease the size of patterns that may be reproducibly etched in an oxide surface by increasing the adhesion of photoresist to the oxide surface.

It is another object of the invention to provide a photoresist coating for the etching of an oxide which will not curl or lift from the edge of etched regions.

Finally, it is another object of the invention to eliminate baking of the photoresist layer prior to etching.

It has been found that these and related objects may be attained by employing a disilylamide, preferably a bis(trialkylsilyl)amide, as a treatment for an oxide surface in an amount sufficient to increase the adhesion of photoresist to the oxide surface. Such disilylamides desirably have the proposed formula:

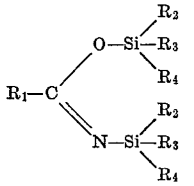

wherein $R_1$ is a hydrocarbyl or substituted hydrocarbyl group having from 1 to 20 carbon atoms, and $R_2$, $R_3$ and $R_4$ are hydrogen or an alkyl group having from 1 to 5 carbon atoms, with only one of $R_2$, $R_3$ or $R_4$ in each case being hydrogen. It is preferred that $R_1$ be an alkyl group having from 1 to 5 carbon atoms and that $R_2$, $R_3$ and $R_4$ be methyl or ethyl groups.

Suitable specific examples of such bis(trialkylsilyl) amides include bis(trimethylsilyl)acetamide, bis(triethylsilyl)acetamide, bis(tripropylsilyl)acetamide, the corresponding derivatives of propionamide, n-butyramide, n-valeramide, stearamide, benzamide; and the like. These bis(trialkylsilyl)amides may be prepared by methods known in the art, such as by reacting the amide with a trialkylchlorosilane in the presence of an acid acceptor, as disclosed by Klebe, Finkbeiner, and White, J.A.C.S., 88, 3390 (1966). The preferred bis(trialkylsilyl)amide is bis-(trimethylsilyl)acetamide.

The disilylamide can be applied full strength or can be applied in admixture with a diluent such as trifluorotrichloroethane. It can be applied by any one of several common coating techniques. For example, the disilylamide may be applied by spray spinning, whereby a quantity of the resist is coated onto the wafer and the wafer is subjected to centrifugal force at speeds of from 3000 to 6000 r.p.m. Alternatively, it may be applied by dipping or immersing the wafer into a solution of the disilylamide. Another good method is to subject the wafer to an atmosphere of the vaporized disilylamide for a period of time and at a temperature sufficient to cause the desired thickness to adhere to the wafer. In general the disilylamide need only be coated onto the wafer to a thickness of up to several angstroms and preferably only to a molecular layer thickness.

Use of a disilylamide results in substantially less undercutting of oxide material covered with photoresist in selective etching operations over the undercutting obtained with the known adhesion promoters, such as the chlorosilanes. In fact, under some conditions, no undercutting of the photoresist covered oxide is observed. The improvement obtained through use of a disilylamide enables more precise etching to be carried out. As a result, semiconductor devices with higher outputs or with a higher density of active components can be provided.

The foregoing and other objects, features, and advantages of the invention will be apparent from the following more particular description of the preferred embodiments of the invention.

DETAILED DESCRIPTION OF THE PREFERRED EMBODIMENTS

Figure 1:
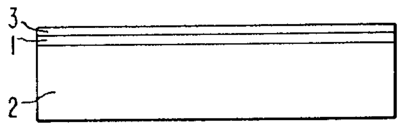
FIGS. 1 to 9 illustrate the sequence for fabricating field effect transistors according to the process of the present invention. For simplicity only a MOS type field effect transistor has been depicted.

To illustrate this invention, reference is made to the fabrication of semiconductor devices in which an oxide layer 1 is provided on a single crystal silicon wafer substrate 2 of FIG. 1. The oxide can be formed by any well known state of the art technique, such as evaporation of silicon dioxide onto the silicon substrate, thermal oxidation of the silicon surface with oxygen, water moisture, air or other oxidizing medium or by the thermal decomposition of siloxanes or the like.

The thickness of the oxide may vary from a few hundred angstroms to many hundreds of thousands of angstroms, depending upon the particular oxidation step or particular purpose for which the oxide is formed.

One good method for forming the oxide surface is by oxidation of the silicon substrate with oxygen at a temperature of about 1050° C. by flowing two liters per minute of oxygen past a 3 to 5 micron silicon wafer for about 16 hours. After the oxide layer is formed, a thin coating 3 of a disilylamide, such as bis(trimethylsilyl)acetamide, is applied thereto.

A suitable photoresist material 4 is then applied over the disilylamide layer 3. The adhesion of a wide variety of photoresist coatings can be increased by the techniques of this invention. Among those resists found to be especially suitable include the compositions based on polyvinyl cinnamate, polyisoprene, natural rubber resins, formaldehyde novolaks, cinnamylidene or polyacrylic esters. Examples of these photoresists include commercially available KPR–2, a polyvinyl cinnamate based composition having a molecular weight of from 14,000 to 115,000, KTFR, a partially cyclized polymer of cis-1, 4-isoprene having an average molecular weight of from 60,000 to 70,000; KMER, a natural rubber resin based composition; Shipley AZ–1350, an m-cresol formaldehyde novolak resin composition; and KOR, a cinnamylidene or poly-β-styril acrylic ester coating composition. These photoresists normally contain small amounts of a photoinitiator or a photosensitizer which decomposes under the action of ultraviolet light to yield a free radical species which initiates the polymerization or depolymerization reaction. Especially suitable photoinitiators, well known in the art, include the azides, such as 2,6-bis(p-azidobenzylidene)-4-methylcyclohexane, the diazo oxides, such as 1-oxo-2-diazo-5-sulfonate ester of naphthalene, and the thioazo compounds, such as 1-methyl-2-m-chloro-benzoylmethylene-β-naphtho-thiazoline, as disclosed in U.S. Pat. 2,732,301.

Figure 2:
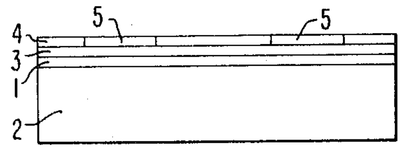
Figure 3:
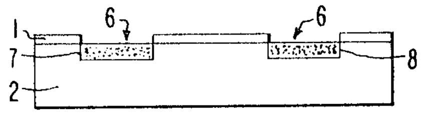

The thickness of the photoresist to be applied depends upon the particular photoresist used and upon the particular technique and purpose for applying the photoresist. Normally, thicknesses between 8,000 and 20,000 A. are adequate. The photoresist layer is subjected to a suitable light pattern so as to cause selective polymerization or depolymerization which provides a source-drain pattern 5 of FIG. 2 on the silicon dioxide layer. While the spacing between the source and the drain was previously limited by the amount of undercutting of the oxide film occurring during etching, by the present technique, the gate and source can be spaced at a much closer distance with the only limitation being the degree to which the impurity will tend to spread after it enters the silicon body. The unpolymerized or depolymerized regions of the photoresist are then removed with a suitable solvent, such as methylene chloride, aqueous alkali solutions, or the like, and the surface of the wafer is subjected to an oxide etchant solution. Suitable etchant solutions include buffered hydrogen fluoride, such as hydrogen fluoride buffered with ammonium fluoride and the like, which provide the source and drain openings 6 of FIG. 3. It is noted that during etching the photoresist coating remains firmly bound to the oxide surface and that curling of the photoresist and undercutting of the oxide surface is virtually eliminated.

Figure 5:
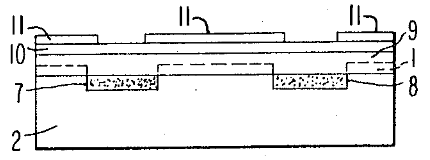
Figure 6:
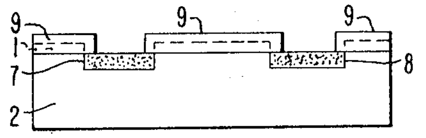
Figure 7:
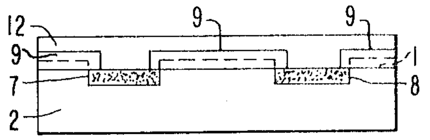
Figure 4:
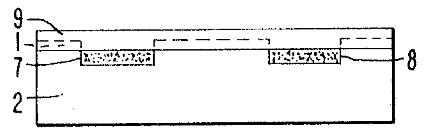
Figure 8:
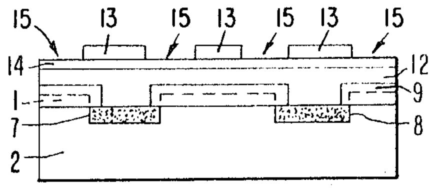
Figure 9:
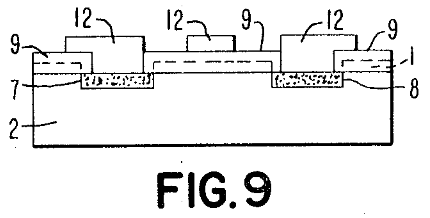

An N or P-type diffusion can be conducted with phosphorus, arsenic, antimony, boron, aluminum, gallium, or indium to form source region 7 and drain region 8 with an oppositely charged region between them, which will subsequently become the gate or the conductor channel. If boron P-type is selected as the dopant, diffusion can be conducted using boron trioxide at 1250° C. for about four hours, thereby forming the drain, source and date. A second layer 9 of silicon dioxide of about 1,000 to 5,000 angstroms thickness may be deposited over the surface as depicted in FIG. 4. For purposes of clarity, the two silicon dioxide layers 1 and 9 are differentiated from each other, although in actuality they are continuous. A coating of disilylamide 10 is again applied over the silicon dioxide layer and a photoresist layer 11 is formed over it in the manner shown in FIG. 5. The silicon dioxide in the open portions of the pattern is etched as previously described with buffered hydrogen fluoride and the photoresist removed, which results in the device shown in FIG. 6. Aluminum 12 is evaporated over the entire surface, resulting in the structure shown in FIG. 7 and another layer of photoresist 13 is deposited over disilylamide layer 14 and developed as shown in FIG. 8. After developing the resist, the aluminum in the open portions 15 of the photoresist pattern is etched with a sodium hydroxide solution resulting in the structure shown in FIG. 9. It will be noted that the aluminum directly contacts the source and drain regions but that it is insulated from the gate by silicon dioxide as in conventional field effect structures. These latter structures are commonly referred to as insulated gate field effect transistors, designated as IGFET's. Such structures are useful as interconnected isolated devices or integrated devices in computer logic circuits.

While this invention has been described principally in terms of preparing semiconductor devices, it should be understood that it has general applicability to any process which requires adhering a photoresist to any oxide surface. For example, the techniques of this invention can be used for preparing printed circuit boards, flat film memory units, wherein a thin film is protected by an oxide surface, double layer modules, gravure printing, wherein an oxide base is involved, preparation of photomasks in general, for glass plates, and many other oxide surfaces.

While it is not fully understood, it is believed that the silicon in the disilylamide reacts with the oxide of the surface while the photoresist tends to adhere strongly to the organic portions of the molecule. The disilylamides have general applicability, therefore, and are generally effective for adhering a photoresist to an oxide surface, such as silicon dioxide, silicon monoxide, aluminum oxide, thorium oxide, sulfur oxide, copper oxide, beryllium oxide, titanium oxide, zinc oxide, nickel oxide and cobalt oxide, and the like.

The following non-limiting examples describe further preferred embodiments of the invention.

EXAMPLE I

Bis(trimethylsilyl)acetamide is evaluated in comparison with chlorosilane adhesion promoters on phosphorous doped $SiO_2$ thermally grown on the surface of semiconductor wafers. This surface is chosen because satisfactory photoresist adhesion to it is difficult to obtain. The adhesion promoters are applied to the $SiO_2$ by coating the entire surface with the adhesion promoter in static condition, then spin drying at 4,000 r.p.m. for 15 seconds. A solution of Kodak KTFR photoresist in xylene is then applied in the static condition and spun dry for 30 seconds at 4,000 r.p.m.. After baking for 8 to 10 minutes on a hot plate at 100° C. to remove solvents, the photoresist is exposed to light through a mask having an array of patterns for semiconductor devices for six seconds. The photoresist is then developed according to conventional techniques with Kodak KMER developer, a mixture of technical grade xylene and a petroleum fraction. Half of the wafers treated with each adhesion promoter are then post-baked for 30 minutes at 180° C. The remaining wafers from each group are tetched without post-bake.

All of the wafers are then etched for 5 minutes at 30° C. in a buffered etch solution consisting of 7 parts by volume of a saturated solution of ammonium fluoride in water, i.e., about a 40 weight percent solution, and 1 part by volume of reagent grade hydrogen fluoride, i.e., about a 48 percent by weight solution in water. The adhesion promoter solutions used and the results obtained from a microscopic examination of the etched $SiO_2$ are shown in the following table.

| | Average undercutting (in microinches) | |
|---|---|---|
| Adhesion promoter | Post-baked | No post-bake |
| 100% bis(trimethylsilyl)-acetamide | 30-50 | 30-50 |
| 10 vol. percent bis(trimethylsilyl)-acetamide in trichloroethylene | 30-50 | 30-50 |
| 100% dimethylchlorosilane | 70 | 70 |
| 10 vol. percent dimethylchlorosilane in trichloroethylene | 70 | 70 |
| 10 vol. percent trimethylchlorosilane in trichloroethylene | 170 | 180 |
| 1.0 vol. percent dimethyldichlorosilane in trichloroethylene | 100 | 140 |
| 2.0 vol. percent phenyltrichlorosilane in trichloroethylene | 130 | 200 |

Our experimental work indicates no apparent difference in the amount of undercutting obtained with a particular adhesion promoter within the dilution ranges used above. The above results show that an equally small amount of undercutting is obtained with elimination of the post-baking step if bis(trimethylsilyl)acetamide is used as the adhesion promoter. With the chlorosilanes, the evolution of gaseous hydrochloric acid was observed in all instances on application, necessitating the use of stainless steel application equipment. With all of the chlorosilanes except dimethylchlorosilane, the formation of polymeric residue on the application equipment is observed. No residue or corrosive vapor is observed with the use of bis(trimethylsilyl)acetamide.

EXAMPLE II

The procedure of Example I is repeated with the bis(trimethylsilyl)acetamide adhesion promoter except that the $SiO_2$ surface is not doped with phosphorus. Microscopic examination of the etched surface shows no observable undercutting with either the 10% or the 100% solution, with or without post-baking.

Substitution of bis(trimethylsilyl)propionamide, bis(triethylsilyl)acetamide, and other disilylamides in the procedure of Example I gives similar advantageous results.

While the invention has been particularly shown and described with reference to preferred embodiments thereof, it will be understood by those skilled in the art that various changes in form and details may be made therein without departing from the spirit and scope of the invention.

What is claimed is:

1. A process for increasing the adhesion of a photoresist to an oxide surface which comprises applying an amount sufficient to increase the adhesion of the photoresist to the oxide surface of a disilylamide.

2. The process of claim 1 wherein the oxide surface is silicon oxide.

3. The process of claim 1 wherein the disilylamide has the formula:

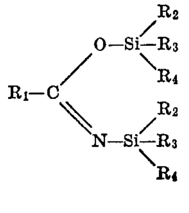

wherein $R_1$ is a hydrocarbyl or substituted hydrocarbyl group having from 1 to about 20 carbon atoms, and $R_2$, $R_3$ and $R_4$ are hydrogen or an alkyl group having from 1 to 5 carbon atoms, with only one of $R_2$, $R_3$ or $R_4$ in each case being hydrogen.

4. The process of claim 3 wherein $R_1$ is an alkyl group having from 1 to 5 carbon atoms and $R_2$, $R_3$ and $R_4$ is a methyl or ethyl group.

5. The process of claim 3 wherein $R_1$, $R_2$, $R_3$ and $R_4$ are methyl groups.

6. The method of claim 1 wherein the photoresist comprises polyvinyl cinnaminate, polyisoprene, a natural rubber resin, a formaldehyde novolak, cinnamylidene or a polyacrylic ester.

7. The method of claim 1 wherein said photoresist material is a partially cyclized polymer of cis-1,4-isoprène having an average molecular weight of 60,000 to 70,000 and containing an azide photoinitiator.

8. In the method of fabricating semiconductor device wherein a pattern is etched in an oxide surface of the semiconductor device using photoresist to prevent contact between an etchant and a part of the oxide surface, the improvement comprising applying a solution containing a sufficient amount to increase the adhesion of the photoresist to the oxide surface of a compound having the formula:

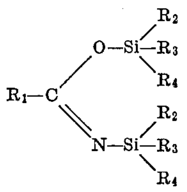

wherein $R_1$ is an alkyl group containing from 1 to 5 carbon atoms and $R_2$, $R_3$ and $R_4$ are a methyl or ethyl group prior to application of the photoresist.

9. The method of claim 8 wherein $R_1$, $R_2$, $R_3$ and $R_4$ are methyl groups.

10. In a method for fabricating semiconductor devices in which an impurity is diffused into a single crystal silicon through a silicon dioxide mask, the improvement comprising forming the silicon dioxide mask by forming a silicon dioxide coating onto the silicon substrate, coating the silicon dioxide surface with bis(trimethylsilyl) acetamide, forming a photoresist layer on the bis(trimethylsilyl) acetamide coating, exposing and developing the photoresist and etching the silicon dioxide through the photoresist to form the silicon dioxide mask.

11. The method of claim 10 wherein said photoresist comprises polyvinyl cinnaminate, polyisoprene, a natural rubber resin, a formaldehyde novolak, cinnamylidene or a polyacrylic ester.

References Cited

UNITED STATES PATENTS

| | | | |
|---|---|---|---|
| 3,455,725 | 7/1969 | Jex et al. | 117—72 |
| 3,482,977 | 12/1969 | Baker | 117—72X |

HAROLD ANSHER, Primary Examiner

J. C. GIL, Assistant Examiner

U.S. Cl. X.R.

96—36; 117—72, 215, 218; 156—307, 315, 329; 260—448.2